US008363990B1

(12) United States Patent
Skogen (10) Patent No.: US 8,363,990 B1
(45) Date of Patent: Jan. 29, 2013

(54) OPTICAL SET-RESET LATCH (75) Inventor: Erik J. Skogen, Albuquerque, NM (US)

(73) Assignee: Sandia Corporation, Albuquerque, NM (US)

(*) Notice: Subject to any disclaimer, the term of this patent is extended or adjusted under 35 U.S.C. 154(b) by 174 days.

(21) Appl. No.: 13/071,095

(22) Filed: Mar. 24, 2011

(51) Int. Cl.
G02B 6/12 (2006.01)
G02B 6/13 (2006.01)
G02F 1/035 (2006.01)

(52) U.S. Cl. ............................................. 385/14; 385/2

(58) Field of Classification Search .................. 385/1, 2, 385/14
See application file for complete search history.

(56) References Cited

U.S. PATENT DOCUMENTS 7,787,719 B1 * 8/2010 Vawter ............................. 385/14
7,995,877 B1 * 8/2011 Skogen et al. .................. 385/14
8,014,639 B1 * 9/2011 Skogen et al. .................. 385/14

OTHER PUBLICATIONS

S. Kodama, et al, 500 Gbit/s Optical Gate Monolithically Integrating Photodiode and Electroabsorption Modulator, Electronics Letters, Apr. 29, 2004 vol. 40 No. 9.
S. Komama, et al, 2.3 Pioseconds Optical Gate Monolithically Integrating Photodiode and Electroabsorption Modulator, Electronics Ltrs Sep. 13, 2001 vol. 37 No. 19, 1185-1186.
James W. Raring, et al, 4-GB/s Widely Tunable Transcievers, IEEE Jounral, vol. 13, No. 1, Jan./Feb. 2007.
James W. Raring ,et al, Design and Demonstration of Novel Qw Intermixing Scheme for the Integration of UTC-Type Photodiodes With QW-Based Components, 2006 IEEE p. 171-181, Feb. 2006.
Erik J. Skogen, et al, Optical Logic Gates Using Interconnected Photodiodes and Electro-Absorption Modulators, OSA/IPR/PS, Figure 1, 2010.
Erik J. Skogen, et al, Monolithically Integrated Active Components: A Quanum-Well Inermixing Approach, 2005 IEEE, vol. 11, No. 2 Mar./Apr. 2005.
Toshihide Yoshimatsu, et al, 100-Gb/s Error-Free Wavelength Conversion with a Monolithic Optical . . ., 2005 IEE, vol. 17, No. 11, Nov. 2005.

* cited by examiner

Primary Examiner — Kevin S Wood
(74) Attorney, Agent, or Firm — Olivia J. Tsai (57) ABSTRACT An optical set-reset (SR) latch is formed from a first electro-absorption modulator (EAM), a second EAM and a waveguide photodetector (PD) which are arranged in an optical and electrical feedback loop which controls the transmission of light through the first EAM to latch the first EAM in a light-transmissive state in response to a Set light input. A second waveguide PD controls the transmission of light through the second EAM and is used to switch the first EAM to a light-absorptive state in response to a Reset light input provided to the second waveguide PD. The optical SR latch, which may be formed on a III-V compound semiconductor substrate (e.g. an InP or a GaAs substrate) as a photonic integrated circuit (PIC), stores a bit of optical information and has an optical output for the logic state of that bit of information.

25 Claims, 8 Drawing Sheets

OPTICAL SET-RESET LATCH

GOVERNMENT RIGHTS

This invention was made with Government support under Contract No. DE-AC04-94AL85000 awarded by the U.S. Department of Energy. The Government has certain rights in the invention.

CROSS REFERENCE TO RELATED APPLICATIONS

The present application is related to U.S. patent application Ser. No. 12/182,683, entitled "Optical NAND Gate," of common assignee filed on Jul. 30, 2008, the contents of which are incorporated herein by reference in their entirety. The present application is also related to U.S. patent application Ser. No. 12/270,221, entitled, "Optical NOR Gate," of common assignee filed on Nov. 13, 2008, the contents of which are incorporated herein by reference in their entirety.

FIELD OF THE INVENTION

Exemplary embodiments of the present invention relate in general to digital optical logic, and in particular to an optical Set-Reset (SR) latch which utilizes waveguide electroabsorption modulators and photodetectors to store optical information.

BACKGROUND OF THE INVENTION

Optical logic gates have been the subject of research for several decades due to the possibility of achieving higher operating speeds than logic based on electronics. The advantages of digital signal processing in the optical domain include higher signal bandwidth, lower signal cross-talk, and greater protection against electronic eavesdropping.

In the development of optical signal processing, there is a desire for optical latches to provide optical memory to store optical information being processed. Exemplary embodiments of the present invention address this desire. The use of all-optical signal processing may also eliminate the need to convert signals from the optical domain into the electronic domain for processing using electronic signal processing circuitry, and then to re-convert the processed signals from the electronic domain back into the optical domain. Thus, all-optical signal processing may be advantageous to reduce the cost, electrical power requirement, size and weight compared to optical-to-electronic converters, electronic signal processing circuitry, and electronic-to-optical converters which are currently being used.

These and other advantages of exemplary embodiments of the present invention exemplary embodiment become evident to those skilled in the art.

SUMMARY OF THE INVENTION

Exemplary embodiments of the present invention relate to optical set-reset (SR) latches, which include a first electroabsorption modulator that is initially electrically biased in a light-absorptive state wherein little, if any, light that is received into an input of the first electroabsorption modulator is transmitted to an output thereof; a second electroabsorption modulator which is optically connected to receive a first portion of the light transmitted through the first electroabsorption modulator with a second portion of the light transmitted through the first electroabsorption modulator being directed to a Q output of the optical SR latch to provide an indication of an optical logic state of the optical SR latch, and with the second electroabsorption modulator being electrically biased in a light-transmissive state wherein a majority of the first light portion received into the input of the second electroabsorption modulator is transmitted to the output thereof; a first waveguide photodetector optically connected to receive a Set light input and the first light portion after transmission through the second electroabsorption modulator, with the first waveguide photodetector being electrically connected to the first electroabsorption modulator, and with the first waveguide photodetector, upon detecting the Set light input, generating a photocurrent signal which temporarily changes the electrical biasing of the first electroabsorption modulator and switches the first electroabsorption modulator to the light-transmissive state so that the first light portion transmitted through the second electroabsorption modulator to the first waveguide photodetector increases in intensity to a light level which continues to generate the photocurrent signal after the Set light input diminishes in intensity, thereby latching the first electroabsorption modulator in the light-transmissive state; and a second waveguide photodetector optically connected to receive a Reset light input, with the second waveguide photodetector being electrically connected to the second electroabsorption modulator, and with the second waveguide photodetector, upon detecting the Reset light input, generating another photocurrent signal which temporarily changes the electrical biasing of the second electroabsorption modulator to switch the second electroabsorption modulator to the light-absorptive state wherein the first light portion transmitted through the second electroabsorption modulator to the first waveguide photodetector diminishes in intensity to a light level wherein the photocurrent signal generated by the first waveguide photodetector is insufficient to maintain the first electroabsorption modulator in the light-transmissive state so that the first electroabsorption modulator switches back to the light-absorptive state. The light received into the input of the first electroabsorption modulator may be continuous light (e.g. at a wavelength in the range of 0.8-2.0 microns), and may be provided by a laser. The first and second light portions may be split out from the light transmitted through the first electroabsorption modulator by an optical splitter.

The first and second electroabsorption modulators and the first and second waveguide photodetectors may be located on a substrate. A plurality of optical waveguides may also be provided on the substrate to optically connect the first electroabsorption modulator to the second electroabsorption modulator, to optically connect the second electroabsorption modulator to the first waveguide photodetector, to guide the second light portion to the Q output of the optical SR latch, to guide the Set light input into the first waveguide photodetector, and to guide the Reset light input into the second waveguide photodetector. A laser may further be located on the substrate to generate the light for the input of the first electroabsorption modulator.

The substrate may include a III-V compound semiconductor. As a first example, the substrate may include an indium phosphide (InP) substrate, and the first and second electroabsorption modulators and the first and second waveguide photodetectors may be formed from a plurality of III-V compound semiconductor layers which are epitaxially grown on the InP substrate. In this first example, the plurality of III-V compound semiconductor layers may be select from the group consisting of InP layers, indium gallium arsenide phosphide (InGaAsP) layers, indium gallium arsenide (InGaAs)

layers, indium aluminum gallium arsenide (InAlGaAs) layers, and combinations thereof.

As a second example, the substrate may include a gallium arsenide (GaAs) substrate, and the first and second electroabsorption modulators and the first and second waveguide photodetectors may be formed from a plurality of III-V compound semiconductor layers epitaxially grown on the GaAs substrate. These III-V compound semiconductor layers may be selected from the group consisting of GaAs layers, aluminum gallium arsenide (AlGaAs) layers, indium gallium arsenide phosphide (InGaAsP) layers, indium gallium arsenide (InGaAs) layers, and combinations thereof.

The optical SR latch of may further include one or more semiconductor optical amplifiers (SOAs) to amplify an optical signal selected from the group consisting of the first light portion, the second light portion, the Set light input and the Reset light input.

The Set light input and the Reset light input may include pulses of light which are gated in response to a clock input from an optical clock.

Exemplary embodiments of the present invention also relate to optical SR latches, which include a substrate having a first electroabsorption modulator, a second electroabsorption modulator, a first waveguide photodetector and a second waveguide photodetector formed thereon. The first and second electroabsorption modulators and the first waveguide photodetector are arranged to provide an optical and electrical feedback loop which controls whether the first electroabsorption modulator is in a light-transmissive state, or in a light-absorptive state. The light-transmissive state may be set by providing a Set light input into the first waveguide photodetector to generate a photocurrent which reduces an electrical bias voltage across the first electroabsorption modulator. This allows the first electroabsorption modulator to be latched in the light-transmissive state by feedback of a continuous light input through the first and second electroabsorption modulators to the first waveguide photodetector to maintain the photocurrent and the reduced electrical bias voltage across the first electroabsorption modulator. When the first electroabsorption modulator is in the light-transmissive state, the electroabsorption modulator may be reset to the light-absorptive state by providing a Reset light input into the second waveguide photodetector to reduce the feedback of the continuous light input through the second electroabsorption modulator. This reduces the photocurrent generated by the first waveguide photodetector and thereby increases the electrical bias voltage across the first electroabsorption modulator, with the increased electrical bias voltage switching the first electroabsorption modulator to the light-absorptive state until such time as another Set light input is provided to the first waveguide photodetector. The Set and Reset light inputs may be in the form of light pulses. A portion of the continuous light input transmitted through the first electroabsorption modulator is coupled to an optical output for the optical SR latch to indicate a logic state of the optical SR latch. This logic state may be used to store a bit of optical information in the optical SR latch.

The substrate may include a III-V compound semiconductor substrate (e.g. an InP substrate or a GaAs substrate). When the substrate includes an InP substrate, each electroabsorption modulator and each waveguide photodetector may be formed from a plurality of III-V compound semiconductor layers epitaxially grown on the InP substrate, with the plurality of III-V compound semiconductor layers being selected from the group consisting of InP layers, indium gallium arsenide phosphide (InGaAsP) layers, indium gallium arsenide (InGaAs) layers, indium aluminum gallium arsenide (InAlGaAs) layers, and combinations thereof. When the substrate includes a GaAs substrate, each electroabsorption modulator and each waveguide photodetector may be formed from a plurality of III-V compound semiconductor layers which are epitaxially grown on the GaAs substrate, with the plurality of III-V compound semiconductor layers being selected from the group consisting of GaAs layers, aluminum gallium arsenide (AlGaAs) layers, indium gallium arsenide phosphide (InGaAsP) layers, indium gallium arsenide (InGaAs) layers, and combinations thereof.

The optical SR latch may further include a plurality of optical waveguides on the substrate to guide the Set light input to the first waveguide photodetector, to guide the Reset light input to the second waveguide photodetector, to guide the continuous light input to the first electroabsorption modulator, to optically connect the first electroabsorption modulator to the second electroabsorption modulator and to the optical output for the optical SR latch, and to optically connect the second electroabsorption modulator to the first waveguide photodetector.

The continuous light input is provided may be at a wavelength in the range of 0.8-2.0 microns, and, in some exemplary embodiments of the present invention, may be provided by a laser on the substrate. The Set light input and the Reset light input may include pulses of light (e.g. digital optical data pulses) which are gated in response to a clock input from an optical clock. The time duration of these light pulses may be extremely short (e.g. $\leq 50$ picoseconds).

The optical SR latch may further include one or more semiconductor optical amplifiers (SOAs) on the substrate to amplify an optical signal selected from the group consisting of the Set light input, the Reset light input, the continuous light input, and the portion of the continuous light input which provides the optical output for the optical SR latch. An optical waveguide splitter may also be provided in the optical SR latch to separate the portion of the continuous light input which is coupled to the optical output from another portion of the continuous light input which is directed through the second electroabsorption modulator to the first waveguide photodetector.

Exemplary embodiments of the present invention further relate to an optical SR latches, which include a substrate; a first electroabsorption modulator on the substrate, with the first electroabsorption modulator being electrically biased to provide a light-absorptive state wherein a majority of any light provided to an input of the first electroabsorption modulator is absorbed therein; a second electroabsorption modulator on the substrate, with the second electroabsorption modulator being electrically biased to provide a light-transmissive state wherein a majority of any light provided to the input of the second electroabsorption modulator is transmitted through the second electroabsorption modulator to an output thereof; a first waveguide photodetector on the substrate and electrically Connected in parallel with the first electroabsorption modulator, with the first waveguide photodetector, upon detecting a Set light input provided thereto, generating a first photocurrent signal which changes the electrical biasing of the first electroabsorption modulator, thereby switching the first electroabsorption modulator from the light-absorptive state to the light-transmissive state to allow transmission of a continuous light input through the first electroabsorption modulator with a first portion of the continuous light input being transmitted through the second electroabsorption modulator to the first waveguide photodetector to continue to generate the first photocurrent signal when the Set light input is no longer present and thereby latch (i.e. maintain) the first electroabsorption modulator in the light-transmissive state, and with a second portion of the continuous light input being guided to a Q output of the optical SR latch to provide an indication of an optical logic state of the optical SR latch; and a second waveguide photodetector on the substrate and electrically connected in series with the second electroabsorption modulator, with the second waveguide photodetector, upon detecting a Reset light input provided thereto, generating a second photocurrent signal which changes the electrical biasing of the second electroabsorption modulator, thereby switching the second electroabsorption modulator from the light-transmissive state to the light-absorptive state wherein the first portion of the continuous light input which reaches the first waveguide photodetector is diminished in intensity thereby reducing the first photocurrent signal and resetting the first electroabsorption modulator in the light-absorptive state until such time as another Set light input is provided to the first waveguide photodetector.

The optical SR latch may further include a plurality of optical waveguides on the substrate to guide the Set light input to the first waveguide photodetector, to guide the Reset light input to the second waveguide photodetector, to guide the continuous light input to the first electroabsorption modulator, to guide the first portion of the continuous light input to the second electroabsorption modulator and therefrom to the first waveguide photodetector, and to guide the second portion of the continuous light input to the Q output.

The substrate may include a III-V compound semiconductor substrate. Each electroabsorption modulator each waveguide photodetector may be formed from a plurality of III-V compound semiconductor layers which are epitaxially grown on the III-V compound semiconductor substrate. In certain exemplary embodiments of the present invention wherein the substrate includes indium phosphide (InP), the plurality of III-V compound semiconductor layers may be selected from the group consisting of InP layers, indium gallium arsenide phosphide (InGaAsP) layers, indium gallium arsenide (InGaAs) layers, indium aluminum gallium arsenide (InAlGaAs) layers, and combinations thereof. In other exemplary embodiments of the present invention wherein the substrate includes gallium arsenide (GaAs), the plurality of III-V compound semiconductor layers may be selected from the group consisting of GaAs layers, aluminum gallium arsenide (AlGaAs) layers, indium gallium arsenide phosphide (InGaAsP) layers, indium gallium arsenide (InGaAs) layers, and combinations thereof.

The continuous light input may be provided by a laser, and may be at a wavelength in the range of 0.8-2.0 microns. In certain exemplary embodiments of the present invention, the laser may be formed on the substrate from the plurality of III-V compound semiconductor layers which are epitaxially grown on the substrate.

The optical SR latch may further include one or more semiconductor optical amplifiers (SOAs) on the substrate to amplify an optical signal selected from the group consisting of the first portion of the continuous light input, the second portion of the continuous light input, the Set light input, and the Reset light input. The Set light input and the Reset light input may include pulses of light which are gated in response to a clock input from an optical clock.

Additional advantages and novel features of the invention exemplary embodiment become apparent to those skilled in the art upon examination of the following detailed description thereof when considered in conjunction with the accompanying drawings. The advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several exemplary aspects of the present invention and, together with the description, serve to explain the principles of the invention. The drawings are only for the purpose of illustrating exemplary embodiments of the invention and are not to be construed as limiting the invention. In the drawings:

FIGS. 3A-3G are taken along the section line 1-1 in FIG. 2; and FIG. 3H is taken along the section line 2-2 in FIG. 2.

DETAILED DESCRIPTION OF THE INVENTION

In the development of optical signal processing, there is a desire for optical latches to provide optical memory to store optical information being processed. Exemplary embodiments of the present invention address this desire by providing an optical Set-Reset (SR) latch that provides a bi-stable operation to store a bit of optical information in digital optical form and to provide that bit of optical information to a Q output of the optical SR latch. An optical state of the SR latch may be switched in response to a Set or Reset optical input provided to the optical SR latch. Only direct current (dc) electrical power sources are required to operate the optical SR latch which may retain the bit of optical information stored therein indefinitely as long as the dc electrical power is provided to the SR latch. This dc electrical power is used to bias waveguide photodetectors and electroabsorption modulators used in the optical SR latch, and to operate one or more semiconductor lasers to provide continuous light which is used to store the bit of optical information within the SR latch, and to operate one or more optional semiconductor optical amplifiers (SOAs) for amplification of optical signals in the optical SR latch.

Figure 1:
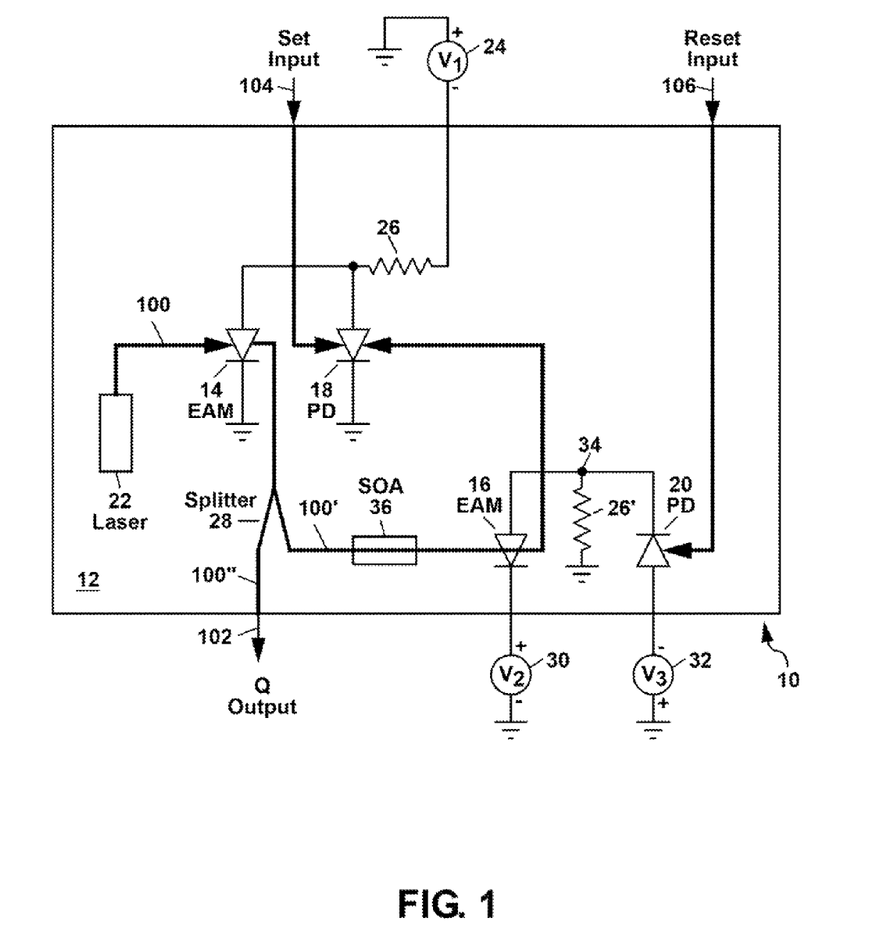
FIG. 1 shows a schematic diagram of a first example of the optical SR latch of the present invention.

Referring to FIG. 1, there is shown a schematic diagram of a first example of the optical Set-Reset (SR) latch 10 of the present invention which may be formed as a photonic integrated circuit (PIC). The optical SR latch 10 includes a substrate 12 on which are formed a first electroabsorption modulator (EAM) 14, a second EAM 16, a first waveguide photodetector (PD) 18 and a second waveguide PD 20. The first and second EAMs 14 and 16 and the first waveguide PD 18 are arranged to provide an optical and electrical feedback loop which controls an electrical bias voltage across the first EAM 14 to latch the first EAM 14 in a light-transmissive state, or in a light-absorptive state. In the light-transmissive state, the first EAM 14 transmits a majority of any light 100 which is provided at an input of the first EAM 14 to an output thereof; whereas in the light-absorptive state, the first EAM 14 absorbs a majority of the light 100 provided to the input of the first EAM 14 and, thus, preferably transmits little (i.e. $\leq 10\%$), if any, of the light 100 through the first EAM 14 to the output thereof.

The light 100 is commonly injected into the input of the first EAM 14 as continuous light to desirably be converted into a train of light pulses at the output of the first EAM 14 as the first EAM 14 is repeatedly switched between the light-absorptive state and the light-transmissive during operation of the optical SR latch 10. The light 100 may have a wavelength in the range of 0.8-2.0 microns (μm), and may be generated by a laser 22 which may be located on the substrate 12 as shown in the example of FIG. 1. In other exemplary embodiments of the present invention, the light 100 may be provided by a laser 22 which is located off of the substrate 12, with the light 100 being coupled onto the substrate 12 using an optical fiber or free-space coupling (e.g. with a lens).

The first EAM 14 and the first waveguide PD 18 in the optical SR latch 10 in FIG. 1 are electrically connected together in parallel (i.e. with an anode side of the first EAM 14 being electrically connected to the anode side of the first waveguide PD 18) and are connected to a first direct-current (dc) voltage source 24 through a resistor 26. In this arrangement, a photocurrent, which is generated by the first waveguide PD 18 upon detecting light provided into the PD 18, may be used to control the amount of a reverse-bias voltage $V_1$ which is applied across the first EAM 14 and thereby control whether the first EAM 14 is in the light-absorptive state or the light-transmissive state.

Initially, the first EAM 14 is in the light-absorptive state due to the electrical biasing provided by the dc voltage source 24 which reverse-biases the first EAM 14 with a voltage $V_1$ which may be, for example, −5 Volts. The transmission of light through each EAM 14 and 16 depends upon the amount of an applied reverse-bias voltage, with the light being more strongly absorbed due to a Franz-Keldysh effect or a quantum-confined Stark effect as the reverse-bias voltage is increased from zero up to a few Volts. Thus, in the initial light-absorptive state of the first EAM 14, very little, if any, of the light 100 is transmitted through the first EAM 14 and coupled through the second EAM 16 to the first waveguide PD 18 with a majority of the light 100 being absorbed in the first EAM 14. In the initial light-absorptive state of the first EAM 14, there is also very little, if any, of the light 100 which is coupled to a Q output 102 of the optical SR latch 10 so that the Q output may essentially be dark, corresponding to a logical "0" state.

When a relatively high level of light corresponding to a logical "1" state is provided at a Set light input 104 (also termed a Set input) and coupled into the first waveguide PD 18, a photocurrent may be generated in the PD 18. This photocurrent changes the electrical biasing of the first EAM 14 to temporarily switch the EAM 14 from the light-absorptive state to the light-transmissive state. This is due to the photocurrent producing a voltage drop of a few Volts across the resistor 26 so that the amount of the reverse-bias voltage $V_1$ across the first EAM 14 drops down to a relatively low level (e.g. −1 volt), thereby reducing the absorption of the light 100 in the EAM 14 and allowing a majority of the light 100 to be transmitted through the EAM 14. In the light-transmissive state of the first EAM 14, the Q output 102 exemplary embodiment also receive a relatively high level of the transmitted light 100 and, thus, exemplary embodiment be in the logical "1" state.

Those skilled in the art understand that the terms "logical '0' state" and "logical '1' state" are an arbitrary convention and may be reversed. What is important is that there are two different logic states in the Q output 102 of the optical SR latch 10 and that in one logic state a relatively high level of light is present at the Q output 102, and in the other logic state a relatively low level of light is present at the Q output 102.

The light 100 which is transmitted through the first EAM 14 may be split into two portions 100' and 100" using an optical splitter 28 (also termed an optical coupler), with the optical splitter 28 being located on the substrate 12 in the example of FIG. 1. One portion 100' of the transmitted light 100 is directed to the input of the second EAM 16, with the other portion 100" being directed to the Q output 102 of the optical SR latch 10. The light portion 100' in FIG. 1 is coupled around an optical portion of the feedback loop (indicated by the dark line in FIG. 1) from the first EAM 14 to the second EAM 16 and then to first waveguide PD 18. In FIG. 1, the dark line which passes completely through the second EAM 16 indicates that the second EAM 16 is initially in the light-transmissive state; whereas the dark line which is interrupted by the first EAM 14 indicates that the first EAM 14 is initially in the light-absorptive state.

The light portion 100', which is transmitted through the second EAM 16, is coupled into the first waveguide PD 18 and detected to continue to generate the photocurrent when the Set input 104 is no longer present (i.e. no longer at a relatively high light level corresponding to the logical "1" state), thereby latching the first EAM 14 in the light-transmissive state with the Q output being at a relatively high light level (i.e. in the logical "1" state). The Set light input 104 may include a pulse of light with a time duration which may be extremely short (e.g. ≦50 picoseconds).

After providing the Set light input 104, the first EAM 14 exemplary embodiment remain in the light-transmissive state until such time as the optical feedback provided by the light 100' is interrupted and the initial electrical biasing of the first EAM 14 is restored. To interrupt the optical feedback provided by the light 100', a Reset light input 106 (also termed a Reset input) may be provided, with the Reset input 106 being coupled into the second waveguide PD 20. The Reset light input 106 may also include a light pulse with a time duration about the same as the Set light input 104.

In the example of FIG. 1, the second waveguide PD 20 may be electrically connected to the second EAM 16 with separate dc reverse-bias voltage sources 30 and 32 being used for the EAM 16 and the PD 20, respectively, and with a resistor 26' being connected between ground and a node 34 wherein the EAM 16 and the PD 20 are electrically connected together in series (i.e. with a cathode side of the PD 20 being electrically connected to an anode side of the EAM 16). The dc voltage source 30 may provide a reverse-bias voltage $V_2$ of, for example, −1 Volts; and the dc voltage source 32 may provide a reverse-bias voltage $V_3$ of, for example, −5 Volts. In this circuit arrangement for the EAM 16 and the PD 20 in FIG. 1, little, if any, electrical current flows through the resistor 26' when no light is detected by the second waveguide photodetector 20. As a result, the node 34 is at ground electrical potential so that the voltage across the second EAM 16 is approximately equal to $V_2$ (e.g. −1 Volts) resulting in the absorption of the second EAM 16 being low so that the second EAM 16 is in the light-transmissive state. This allows a majority of the light portion 100' to be transmitted through the second EAM 16 to the first waveguide PD 18.

However, when the Reset input 106 is present so that a relatively high level of light corresponding to the logical "1" state provided to the second waveguide PD 20 to generate a photocurrent therein, this photocurrent produces a voltage drop across the resistor 26', thereby increasing the voltage at the node 34 so that the reverse-bias voltage across the second EAM 16 is increased (e.g. to about −3 or −4 Volts). This increased reverse-bias voltage across the second EAM 16 increases the absorption in the second EAM 16, thereby switching the second EAM 16 from the light-transmissive state to the light-absorptive state. In the light-absorptive state, the second EAM 16 reduces the amount of the light portion 100' reaching the first waveguide PD 18; and this reduces the photocurrent generated by the PD 18 which, in turn, increases the amount of the reverse-bias voltage $V_1$ dropped across the first EAM 14 thereby resetting the first EAM 14 back to its initial light-absorptive state. With the first EAM 14 reset to the light-absorptive state, most of the light 100 at the input of the first EAM 14 is absorbed therein so that the light portion 100" at the Q output 102 is at a relatively low light level corresponding to the logical "0" state.

In the example of FIG. 1, the Set and Reset inputs 104 and 106, respectively determine the state of a bit of optical information stored in the optical SR latch 10, with this bit of optical information being set in the logical "1" state when a pulse of light (i.e. a logical "1" state optical input) is provided at the Set input 104, and with the bit of optical information being set in the logical "0" state when a subsequent pulse of light is provided at the Reset input 106. The logic state of the bit of optical information stored in the optical SR latch 102 is provided at any given time to the Q output 102 using the light portion 100". Thus the optical SR latch 10 may be repeatedly set and reset as desired to store optical information therein and to provide this information, as desired, for processing optical data signals. The switching speed of the optical SR latch 10 may be very high (up to tens of Gigabits per second) when each EAM 14, 16 and each PD 18, are formed as traveling-wave devices.

Figure 2:
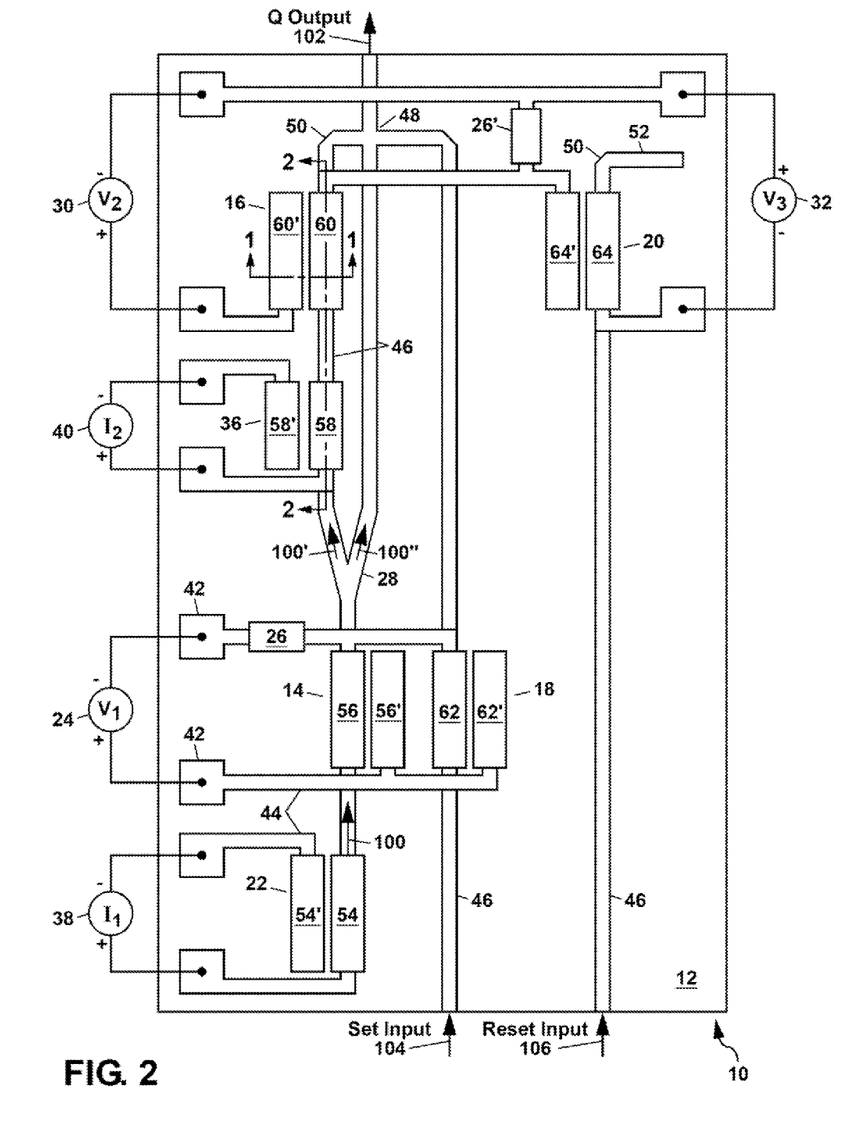
FIG. 2 shows a schematic plan view of the first example of the optical SR latch of FIG. 1.
Figure 5:
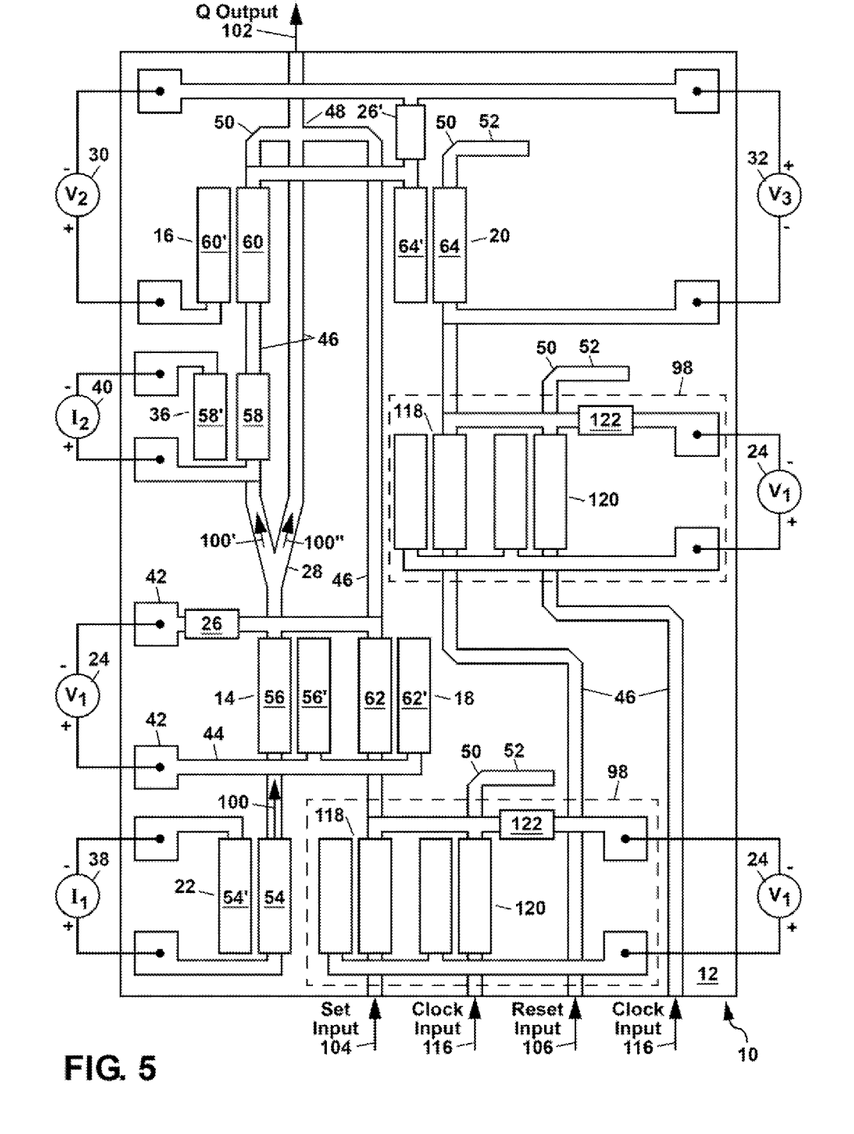
FIG. 5 shows a schematic plan view of the second example of the optical SR latch of FIG. 4.

FIG. 2 shows a schematic plan view of the optical SR latch 10 of FIG. 1. In FIG. 2, the laser 22 is located on the substrate 12 to generate the continuous light 100; and a semiconductor optical amplifier (SOA) 36 is also provided on the substrate 12 between the first EAM 14 and the second EAM 16 to amplify the light portion 100'. A first dc current source 38 may be used to provide a dc current $I_1$ to operate the laser 22; and a second dc current source 40 may be used to provide another dc current $I_2$ to operate the SOA 36. These current sources 38, 40 together with the voltage sources 24, 30 and 32 may be located off the substrate 12 and connected to bond pads 42 and wiring 44 on the substrate. For high-speed operation (up to a few tens of Gigabits per second or more) of the optical SR latch 10 the wiring 44 may be provided as RF transmission lines. Low-loss RF by-pass capacitors may also be provided on the substrate 12 for high-speed operation of the latch 10. Such RF by-pass capacitors are well-known in the art and have been omitted from FIGS. 2 and 5 for clarity.

The laser 22 in FIG. 2 may be a distributed Bragg reflector (DBR) laser 24 which is forward-biased by the dc current source 38 to generate the light 100 which may be continuous light due to continuous-wave (cw) lasing emission with an optical power level of, for example, 3-10 mW.

In other exemplary embodiments of the present invention, the laser 22 may be located off of the substrate 12. In these exemplary embodiments, the light 100 from the laser 22 may be coupled into an optical waveguide 46 on the substrate 12 using an optical fiber or using free-space coupling (e.g. with a lens).

The SOA 36 in FIG. 2 amplifies the light portion 100' to increase the photocurrent generated by the first waveguide PD 18. As an example, the SOA 36 may provide an optical gain of 4-12 deciBels (dB) depending upon the length of the SOA 36 and whether the SOA 36 is straight or flared. This optical gain provided by the SOA 36 may increase the intensity of the light portion 100' and thereby generate a larger photocurrent in the first waveguide PD 18 which, in turn, exemplary embodiment provide a larger contrast in the light 100 transmitted through the first EAM 14. Additional SOAs 36 may be optionally provided in the optical SR latch 10 to amplify the light portion 100", the Set input 104 and/or the Reset input 106.

The SOA 36 may have a waveguide structure with a gain region which may be either single-mode or multi-mode with a width of, for example, 1-10 µm and a length of, for example, 100-500 µm. In some cases, the width of the gain region may be flared, with a width that increases along the length of the SOA 36. An offset multi-quantum-well (MQW) structure may also be used in the gain region. The use of a flared or offset MQW gain region may be useful to provide a higher saturation power level for the SOA 36.

A plurality of optical waveguides 46 are also provided on the substrate 12 in the example of FIG. 2. These optical waveguides 46 are used to optically connect the laser 22 to the first EAM 14, to optically connect the first EAM 14 to the second EAM 16, to optically connect the second EAM 16 to the first waveguide PD 18, to guide the Set Input 104 into the first waveguide PD 18, to guide the Reset input 106 into the second waveguide PD 20 and to guide the light portion 100" out from the optical splitter 28 to the Q output 102. In the example of FIG. 2, a waveguide crossing 48 may be used to allow the waveguides 46 and the light portions 100' and 100" to cross through each other. The waveguide crossing 48 may be formed by intersecting two waveguides 46 at substantially right angles to each other. The optical waveguides 46 may also include 90° turning mirrors 50 as shown in FIG. 2 to guide the light portion 100' from the second EAM to the first waveguide PD 18, and to form a light trap 52 for any of the light from the Reset input 106 which is not absorbed by the second waveguide PD 20. The optical waveguides 46 in the example of FIG. 2 may be single-mode optical waveguides or multi-mode optical waveguides.

In the example of FIG. 2, the Set input 104 and the Reset input 106 may be coupled into the optical waveguides 46 from optical fibers (not shown), and the light portion 100", which forms the Q output 102, may be coupled out of optical SR latch 10 using another optical fiber. In other exemplary embodiments of the present invention wherein the optical SR latch 10 is formed on a substrate 12 containing other optical logic gates (e.g. OR, NOR, AND and NAND gates), the coupling of these other optical logic gates to the inputs 104, 106 and to the Q output 102 may be performed using additional optical waveguides 46.

In the example of FIG. 2, the laser 22 includes an upper electrode 54 and a lower electrode 54'; the first EAM 14 includes an upper electrode 56 and a lower electrode 56'; the SOA 36 includes an upper electrode 58 and a lower electrode 58'; the second EAM 16 includes an upper electrode 60 and a lower electrode 60'; the first waveguide PD 18 includes an upper electrode 62 and a lower electrode 62'; and the second waveguide PD 20 includes an upper electrode 64 and a lower electrode 64'. The EAMs 14 and 16, PDs 18 and 20, the laser 22 and the SOA 36 in FIG. 2 may all be formed as optical waveguide devices from a plurality of III-V compound semiconductor layers which are epitaxially grown on a III-V compound semiconductor substrate 12. An optical waveguide width for the EAMs 14 and 16, the PDs 18 and 20, the laser 22 and the SOA 36 may be, for example, up to about 10 µm.

An exemplary method of fabrication of the optical SR latch 10 may be described with reference to FIGS. 3A-3G which show a series of schematic cross-section views of the device 10 along the section line 1-1 in FIG. 2 during various steps in the fabrication of the optical SR latch 10, and with reference to FIG. 3H which shows a schematic cross-section view along the section line 2-2 in FIG. 2.

The optical SR latch 10 may be fabricated using a quantum-well intermixing process. This quantum-well intermixing process uses a III-V compound semiconductor substrate 12 upon which a plurality of III-V compound semiconductor layers are epitaxially grown. The III-V compound semiconductor substrate 12 may include, for example, indium phosphide or gallium arsenide. This quantum-well intermixing process allows the fabrication of many different photonic integrated circuit (PIC) elements to be formed on the same substrate 12 in a manner similar to that of semiconductor integrated circuit (IC) fabrication. The quantum-well intermixing process also allows the various PIC elements, which may include the EAMs 14 and 16, the PDs 18 and 20, the laser 22, the SOA 36 and the optical waveguides 46 and splitter 28, to be individually optimized.

Those skilled in the art exemplary embodiment understand that the optical SR latch 10 may also be fabricated using other types of III-V compound semiconductor fabrication methods which are well-known in the art. These other types of III-V compound semiconductor fabrication methods include butt-joint regrowth, selective area growth, and the use of offset quantum wells and are detailed in the following articles which are incorporated herein by reference: E. Skogen et al., "Monolithically Integrated Active Components: A Quantum-Well Intermixing Approach," *IEEE Journal of Selected Topics in Quantum Electronics*, vol. 11, pp. 343-355, March/April 2005; J. W. Raring et al., "40-Gb/s Widely Tunable Transceivers," *IEEE Journal of Selected Topics in Quantum Electronics*, vol. 13, pp. 3-14, January/February 2007.

Figure 3A:
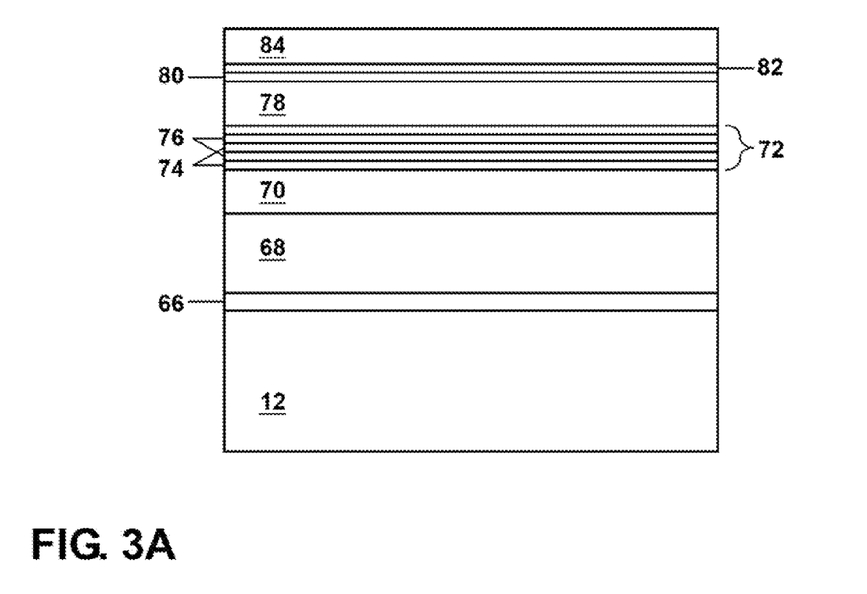
FIGS. 3A-3H show schematic cross-section views along the section lines 1-1 and 2-2 in FIG. 2 to illustrate a series of process steps in the fabrication of the optical SR latch of the present invention.
Figure 3B:
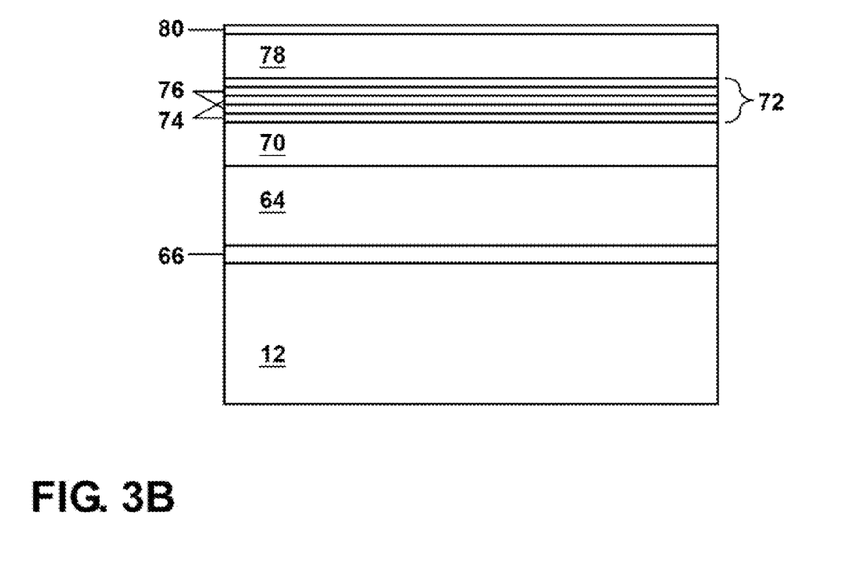

FIG. 3A shows a schematic cross-section view of the plurality of III-V compound semiconductor layers 66 through 84 which may be initially epitaxially grown on the substrate 12 in preparation for fabricating the optical SR latch 10. The III-V compound semiconductor layers may include, for example, indium phosphide (InP), indium gallium arsenide phosphide (InGaAsP), indium gallium arsenide (InGaAs), indium aluminum gallium arsenide (InAlGaAs) layers and combinations thereof when the substrate 12 includes InP. Alternately, the III-V compound semiconductor layers may include gallium arsenide (GaAs), aluminum gallium arsenide (AlGaAs), InGaAsP, InGaAs, and combinations thereof when the substrate 12 includes GaAs. The following discussion exemplary embodiment describe fabrication of the optical SR latch 10 using an InP substrate 12 with InP, InGaAsP and InGaAs layers thereon, but those skilled in the art exemplary embodiment understand that the various process steps described hereinafter may be applied with minor modifications to an optical SR latch 10 formed on a GaAs substrate 12 with a combination of GaAs, AlGaAs, InGaAsP, and InGaAs layers epitaxially grown thereon. Those skilled in the art exemplary embodiment also understand that other III-V compound semiconductor materials may be used for the substrate 12 and the layers epitaxially grown thereon.

In FIG. 3A, the substrate 12 may include a semi-insulating Fe-doped InP substrate 12. A plurality of III-V compound semiconductor layers are epitaxially grown on the Fe-doped InP substrate 12 by metal-organic chemical vapor deposition (MOCVD). These III-V compound semiconductor layers are in order of epitaxial growth: an InP buffer layer (not shown), an n-type InGaAs lower contact layer 66; a lower cladding layer 68 of n-type-doped InP which may be 1-2 μm thick; a lower waveguide layer 70 of InGaAsP which is undoped (i.e. not intentionally doped) and about 0.11 μm thick with a composition selected to provide an energy bandgap wavelength $\lambda_g$=1.3 μm; an undoped MQW region 72 which is about 0.11 μm thick and includes a plurality of alternating quantum well (QW) layers 74 and barrier layers 76 of InGaAsP, with the quantum well layers 74 being about 6.5 nanometers (nm) thick and having an energy bandgap wavelength $\lambda_g$ of, for example, 1.55 μm as measured by photoluminescence, and with the barrier layers 76 being about 8 nm thick and having an energy bandgap wavelength $\lambda_g$=1.3 μm; a upper waveguide layer 78 of undoped InGaAsP about 0.11 μm thick with $\lambda_g$=1.3 μm; an undoped InP etch stop layer 80 about 15 nm thick; an undoped InGaAsP etch stop layer 82 about 20 nm thick with $\lambda_g$=1.3 μm; and an undoped InP implant buffer layer 84 about 0.45 μm thick. As an example, the QW layers 74 may have the semiconductor alloy composition $In_xGa_{1-x}As_yP_{1-y}$ with x=0.735 and y=0.840 to provide the energy bandgap wavelength $\lambda_g$=1.55 μm; and the barrier layers 76 may be formed of $In_xGa_{1-x}As_yP_{1-y}$ with x=0.735 and y=0.513. Those skilled in the art exemplary embodiment understand that the exact compositions and thicknesses of the layers 74 and 76 in the MQW region 72 and the compositions and thicknesses of the other III-V compound semiconductor layers may be adjusted as desired to provide predetermined values for energy bandgaps of these layers, with the energy bandgap wavelength $\lambda_g$ of the QW layers 74 generally being in the range of 0.8-2.0 μm.

An ion implant mask (e.g. including silicon nitride about 0.5 μm thick) may then be provided over the substrate 12 and III-V compound semiconductor layers with openings at locations wherein phosphorous ions are to be implanted into the InP implant buffer layer 84 for use in selectively disordering the MQW region 72. The locations where the PDs 18 and 20 and a gain region of the laser 22 and the SOA 36 are to be formed exemplary embodiment generally not have a disordered MOW region 72 since the MQW region 72 is epitaxially grown to optimize the performance of the PDs 18 and 20 and the gain region of the laser 22 and SOA 36. The phosphorous ions may be implanted into the InP implant buffer layer 84 at an ion energy of about 100 keV and a dose of about $5\times10^{14}$ cm$^{-2}$ with the substrate 12 being at a temperature of about 200° C. The implanted phosphorous ions produce point defects in the InP implant buffer layer 84.

A rapid thermal annealing step may then be used to drive the point defects down into the MQW region 72 to intermix the QW layers 74 and the barrier layers 76 at the interfaces therebetween. This intermixing produces a blue-shift the energy bandgap wavelength in the MQW region 72. The rapid thermal annealing step may be performed at a temperature in the range of 630-700° C. and may be timed for a time interval from about one-half minute up to a few tens of minutes to provide a predetermined energy bandgap wavelength for the MQW region 72 which exemplary embodiment depend upon the exact elements of the optical SR latch 10 being formed. To form the EAMs 14 and 16, a first rapid thermal annealing step may be used to provide a few tens of nanometer blue-shift in the energy bandgap wavelength of the MQW region 72 (e.g. to $\lambda_g$~1.50 μm) to reduce an absorption loss therein in the absence of any reverse-bias voltage. This same blue-shift is provided for the MQW region 72 for the optical waveguides 46 and for distributed Bragg reflector (DBR) mirror regions which are used to form an optical cavity for the laser 22 and for an optional phase control region located within the optical cavity of the laser 22. An additional blue-shift exemplary embodiment be provided in a subsequent thermal annealing step for the optical waveguides 46 and the DBR mirror regions to further increase the blue-shift therein (e.g. to $\lambda_g$~1.43 μm) and thereby further reduce the absorption for these elements of the optical SR latch 10. The blue-shift in the energy bandgap wavelength of the MQW region 72 may be determined using a laser-excited photoluminescence spectroscopy measurement at room-temperature.

After the first rapid thermal annealing step, the InP implant buffer layer 84 may be removed above the EAMs 14 and 16 while leaving the layer 84 in place over the optical waveguides 46 and over the DBR mirror regions. This may be done using a wet etching step to etch away the layer 84, with the wet etching being terminated upon reaching the InGaAsP etch stop layer 82. Removal of the InP implant buffer layer 84 above the EAMs 14 and 16 prevents any further blue-shift in the MQW region 72 at these locations since it removes the source of point defects necessary for quantum-well intermixing.

A second rapid thermal annealing step may then be performed at about the same temperature for up to a few minutes (e.g. 2-3 minutes) to provide further intermixing of the QW and barrier layers 74 and 76, respectively, to produce an additional few tens of nanometers blue-shift the energy bandgap of the MQW region 72 in the remaining regions where the InP implant buffer layer 84 is still present. This additional blue-shift in the energy bandgap of the MQW region 72 further reduces the absorption loss in the optical waveguides 46 and in the DBR mirror regions of the laser 22.

After the second rapid thermal annealing step is performed, the remaining InP implant buffer layer 84 and the InGaAsP etch stop layer 82 may be completely removed from the substrate 12 by wet etching. This is schematically illustrated in the cross-section view of FIG. 3B. Another etching step may then be used to etch a corrugated grating structure down partway into the upper waveguide layer 78 to form a DBR mirror at each end of the laser 22. A rear DBR mirror for the laser 22 may be formed with a length of, for example, 200 μm, and a front DBR mirror in the laser 22 may have a length of, for example, 10-50 μm long. The gain region of the laser 22 may have a length of, for example, 200-500 μm. When a separately-contacted phase control section is to be provided in the laser 22 to provide for tuning of the wavelength of the light 100 generated by the laser 22, the phase control section may have a length of, for example, 75 μm and may be connected through the wiring 44 on the substrate 12 to a separate bond pad 42 (not shown in FIG. 2).

Figure 3C:
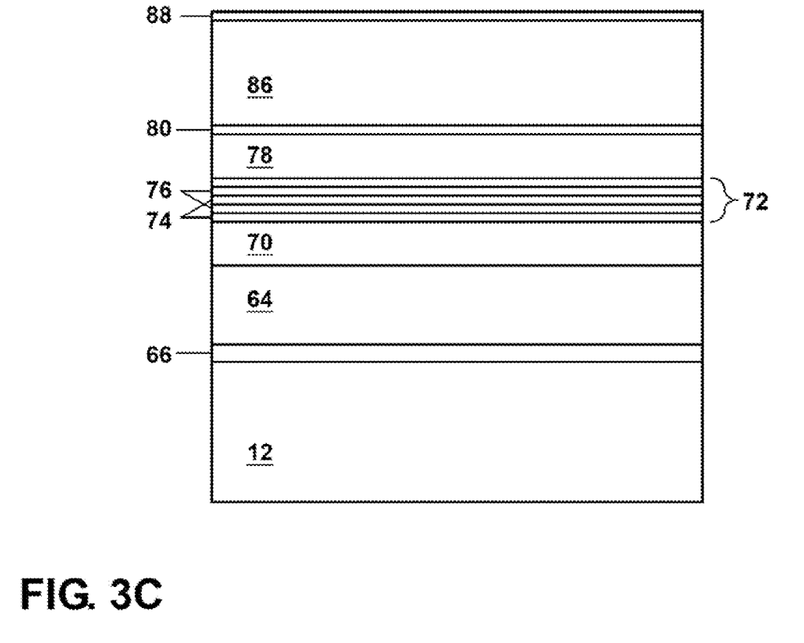

A blanket MOCVD regrowth may then be performed to epitaxially grow an upper cladding layer 86 of p-type-doped InP which may be, for example, 2.35 μm thick followed by a cap layer 88 of p-type-doped InGaAs about 0.2 μm thick. This is shown in FIG. 3C. The p-type-doped InP upper cladding layer 86 in combination with the n-type-doped lower cladding layer 68 form a semiconductor p-i-n junction about the MQW region 72 and waveguide layers 70 and 78 which are undoped (i.e. intrinsic). This semiconductor p-i-n junction is used for electrically-activated elements in the optical SR latch 10 including the EAMs 14 and 16, the waveguide photodetectors 18 and 20, and the gain regions of the laser 22 and SOA 36.

In other exemplary embodiments of the present invention, an offset quantum-well region may be epitaxially grown above the upper waveguide layer 78. This may be useful to form the PDs 18 and 20 as uni-traveling carrier photodetectors, and may also be useful in forming the SOA 36. The use of an offset quantum-well region provides a lower confinement factor than the MQW region 72 and this lower confinement factor may increase the saturation power level for the PDs 18 and 20 and the SOA 36, and may also allow operation at higher frequencies (i.e. higher optical data rates). Further details of the fabrication of photodetectors and semiconductor optical amplifiers using offset quantum-well region may be found in an article by J. W. Raring et al., "Design and Demonstration of Novel QW Intermixing Scheme for the Integration of UTC-Type Photodiodes with QW-Based Components," *IEEE Journal of Quantum Electronics*, vol. 42, pp. 171-181, February 2006, which is incorporated herein by reference.

Figure 3D:
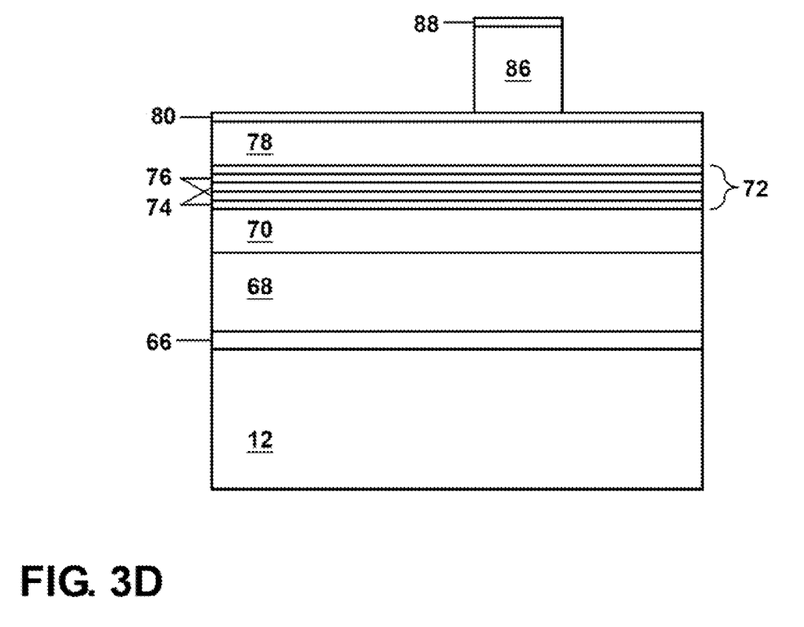

An etch mask (not shown) may be provided over the substrate 12 and photolithographically patterned for use in etching down through the InGaAs cap layer 88 and the InP upper cladding layer 86 as shown in FIG. 3D. This etching step defines an effective waveguide width of the various elements 14, 16, 18, 20, 22, 28, 36 and 46 which may be, for example, up to a few microns or more (e.g. 1-3 μm for the optical waveguides 46, the EAMs 14 and 16 and the laser 22; and 1-10 μm wide for the photodetectors 18 and 20, the SOA 36 and the light trap 52). The PDs 18 and 20 may each have a length of, for example, 30-70 μm and may be straight or tapered. The EAMs 14 and 16 may have a length of, for example, 100-300 μm. For a length of 275 μm, the EAM 14 may provide up to 25 dB or higher extinction of the light 100 in the light-absorptive state at an applied reverse-bias voltage $V_1 = -3.5$ Volts, and may have a peak extinction efficiency of about 13 dB-V$^{-1}$ at $V_1 = -2.4$ Volts.

Figure 3E:
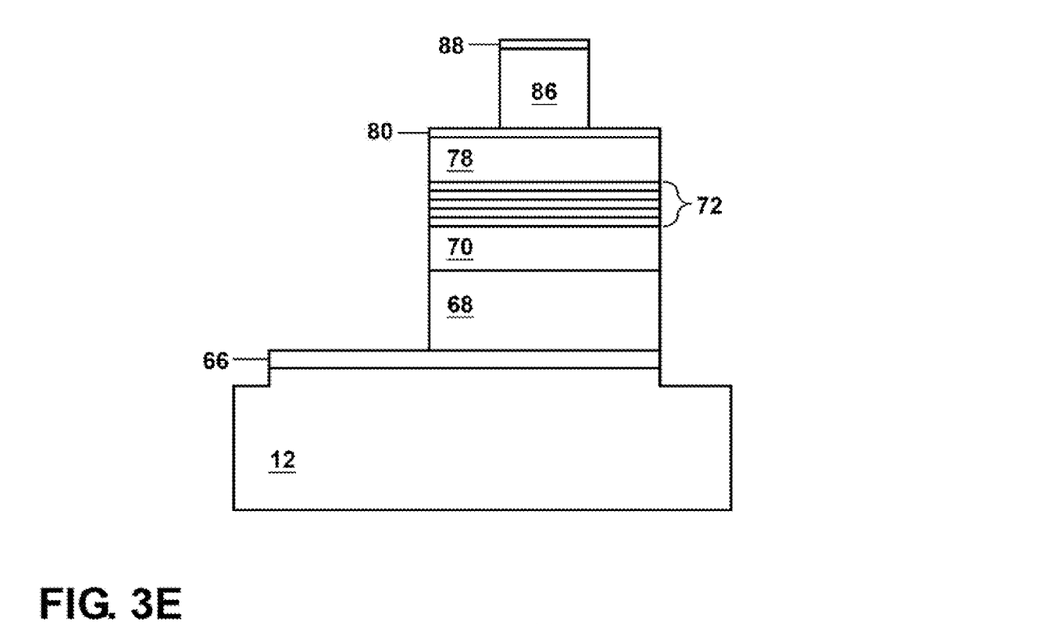

In FIG. 3E, one or more additional etching steps may be used to etch down to the InGaAs lower contact layer 66 and partway into the semi-insulating InP substrate 12. This etching step also forms the 90° turning mirrors 50.

Figure 3F:
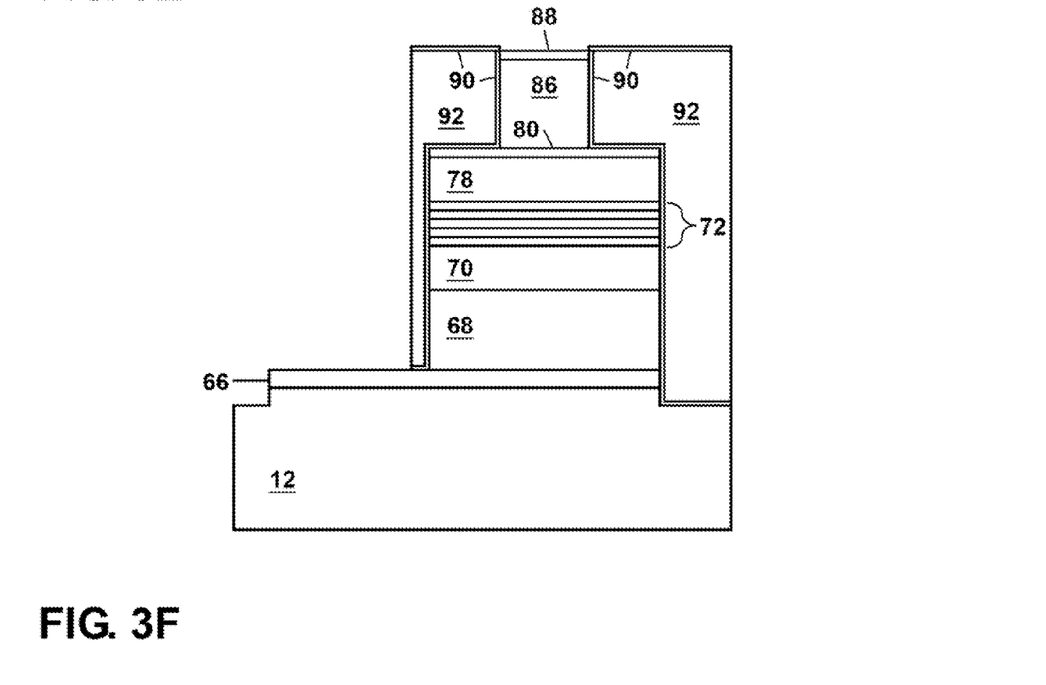

In FIG. 3F, layers of silicon nitride 90 and benzocyclobutene (BCB) 92 may then be deposited over the substrate 12 about the EAMs 14 and 16, the PDs 18 and 20, the lasers 22 and the SOA 36, with openings at the locations where the upper and lower electrodes exemplary embodiment be formed for these elements. The BCB 92 may be optionally tapered towards the bond pads 42 allow the bond pads 42 to be formed directly over the silicon nitride layer 90 on the InP substrate 12. This tapering of the BCB 92 is also useful to allow the resistors 26 and 26' to be located on the silicon nitride layer 90 for heat sinking to the substrate 12. The silicon nitride layers 90 may each be about 0.1-0.2 μm thick.

Figure 3G:
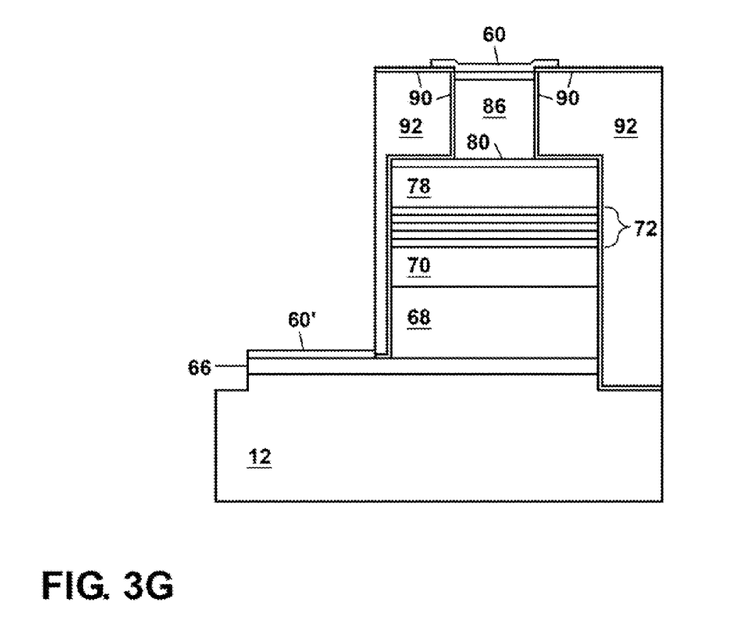

In FIG. 3G, the lower and upper electrodes may be deposited. The lower electrodes 54', 56', 58, 60', 62' and 64' may include a gold/germanium/nickel/gold (Au/Ge/Ni/Au) metallization with an overall thickness of about 0.5 μm; and the upper electrodes 54, 56, 58, 60, 62 and 64 and the bond pads 42 and the wiring 44 may include a titanium/platinum/gold (Ti/Pt/Au) metallization with an overall thickness of about 1 μm. The resistors 26 and 26' may be deposited as thin-film metal resistors (e.g. including tantalum nitride or nichrome), and may have a resistance of, for example, 25-50 Ohms.

Adjacent elements of the optical SR latch 10, which are not optically connected, may be electrically isolated by etching down partway into the semi-insulating InP substrate 12 as shown in FIG. 3G. However, this does not electrically isolate adjacent elements of the optical SR latch 10 which must be optically connected via one of the optical waveguides 46. For these elements including the EAM 14, which is optically connected to the laser 22 and the SOA 36, and the EAM 16, which is optically connected to the SOA 36 and the PD 18, the III-V compound semiconductor layers in an optical waveguide region between these optically-connected elements may be ion implanted to provide electrical isolation. This is illustrated in the schematic cross-section view of FIG. 3H which is taken along the section line 2-2 in FIG. 2 and which shows the SOA 36, the second EAM 16 and the optical waveguide 46 located therebetween.

Figure 3H:
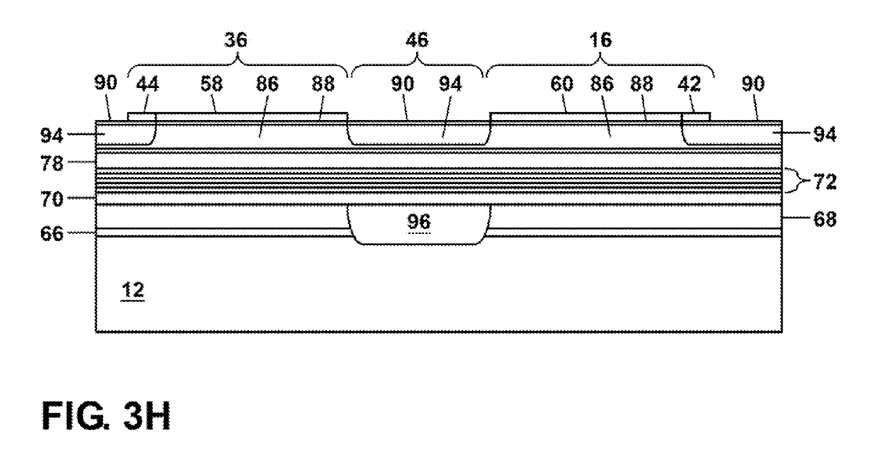

In FIG. 3H, hydrogen ions may be implanted at an energy of about 200 keV to electrically isolate regions 94 of the p-type-doped III-V compound semiconductor layers in the waveguides 46 and around the SOA 36 and the second EAM 16. The other elements 14, 18, 20 and 22 of the optical SR latch 10 may be similarly electrically isolated using the hydrogen ion implantation. The hydrogen-implanted regions 94 may also extend completely around the electrically-active elements 14, 16, 18, 20, 22 and 36 to improve electrical characteristics for these elements.

In FIG. 3H, helium ions may also be implanted at an energy of about 2 MeV to electrically isolate regions 96 of the n-type-doped III-V compound semiconductor layers, with the helium-implanted regions 96 extending down partway into the InP substrate 12. The helium-implanted regions 96 are located where the n-type-doped III-V compound semiconductor layers extend between the SOA 36 and the second EAM 16 as shown in FIG. 3H, and may also be provided between the laser 22 and the first EAM 14, between the first EAM 14 and the SOA 36, and between the second EAM 16 and the first waveguide PD 18. The hydrogen and helium ion implantation steps may be performed with suitable masking to protect the electrically-active elements 14, 16, 18, 20, 22 and 36 after epitaxial growth of the InP layer 86 and the InGaAs cap layer 88 as previously described with reference to FIG. 3C.

Figure 4:
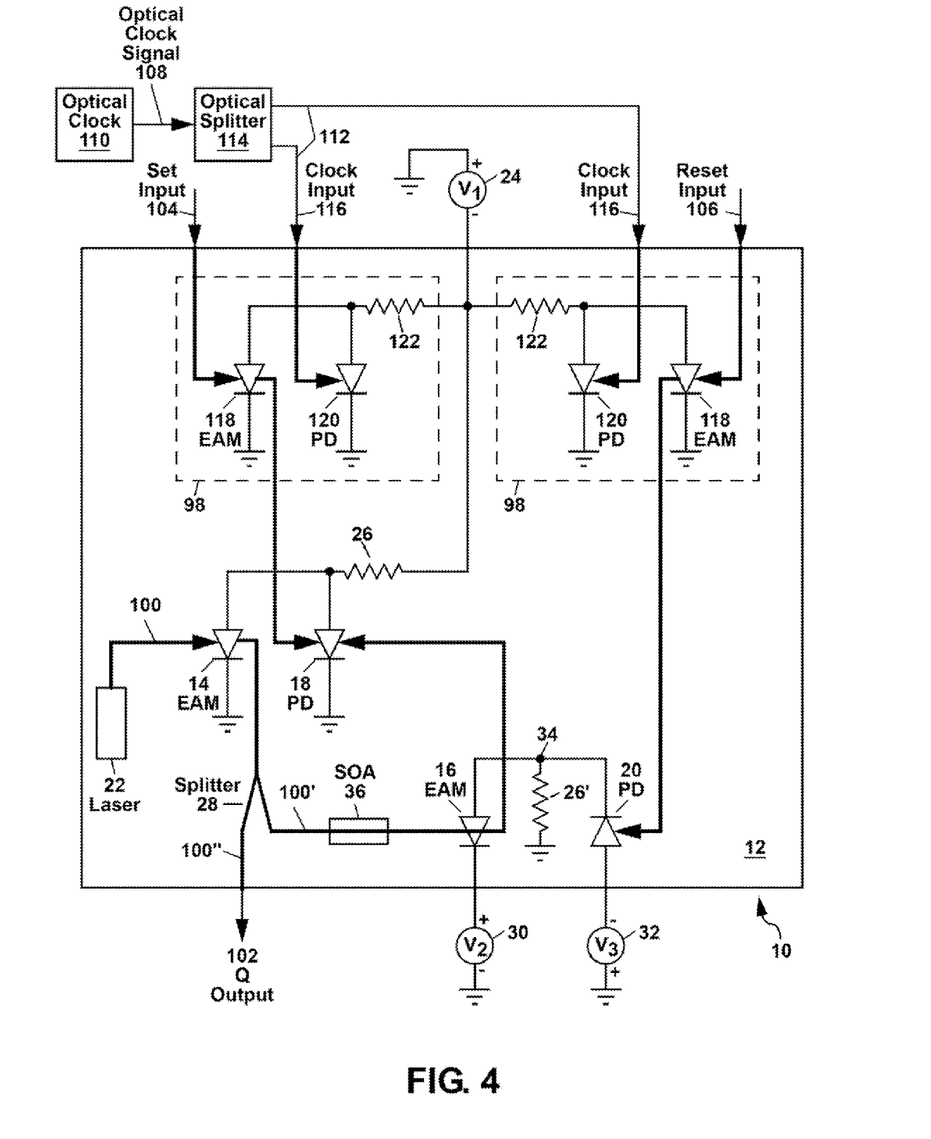
FIG. 4 shows a schematic diagram of a second example of the optical SR latch of the present invention.

FIG. 4 shows a second example of the optical SR latch 10 of the present invention which is clocked. In this clocked example of the optical SR latch 10, a pair of optical AND gates 98 are provided to gate the Set input 104 and the Reset input 106 in response to an optical clock signal 108 (i.e. a train of optical clock pulses) provided by an optical clock 110. The optical clock 110 may be formed, for example, from an intensity-modulated or mode-locked laser and may be located off of the substrate 12 with the optical clock signal 108 being coupled into the optical SR latch 10 using optical fibers 112 or free-space coupling. An optical splitter 114 (e.g. a 1×2 optical fiber coupler) may be used to provide separate clock inputs 116 to the two optical AND gates 98. In other exemplary embodiments of the present invention, the optical clock 110 and/or the optical splitter 114 may be formed on the substrate 12.

In the example of FIG. 4, each optical AND gate 98 may include an EAM 118 and a waveguide PD 120 which are electrically connected together in parallel and connected through a resistor 122 to the dc voltage source 24 which is also used for biasing of the first EAM 14 and the first waveguide PD 18. In each optical AND gate 98, the EAM 118 is initially in the light-absorptive state to effectively block transmission of the Set input 104 and the Reset input 106 until such time as a clock light pulse is provided at the clock input 116 to each optical AND gate 98.

When the Set input 104 or the Reset input 106 coincides with a clock light pulse at the clock input 116, the clock light pulse is detected by the PD 120; and this produces a photocurrent which changes the electrical biasing of the EAM 118 to temporarily switch the EAM 118 to the light-transmissive state, thereby allowing the Set input 104 or the Reset input 106 to be coupled into the PD 18 or the PD 20 and change the logic state of the optical SR latch 10 depending upon the logic state of the latch 10 immediately prior to the clock light pulse and whether a Set input 104 or a Reset input 106 is coupled into the latch 10. If desired, additional SOAs 36 may be provided between the EAMs 118 and the PDs 18 and 20 to amplify the Set and Reset inputs 104 and 106 after these signals have been transmitted through the optical AND gates 98.

After programming the optical SR latch 10 to store a bit of optical information therein via the optical logic state of the latch 10, this bit of optical information exemplary embodiment be retained indefinitely and provided to the Q output 102 as long as electrical power is supplied to the laser 22 to generate the continuous light 100, or until such time as the optical SR latch 10 is re-programmed in response to the clock input 116 and the Set input 104 or the Reset input 106. Switching of the bi-stable optical logic state of the latch 10 may also be performed at a very high data rate of up to several tens of Gigabytes per second ($GBs^{-1}$) or more.

In the examples of the optical SR latch 10 described herein, the first and second EAMs 14 and 16 and the first and second waveguide PDs 18 and 20 are located on the same substrate 12. In other exemplary embodiments of the present invention, each EAM/PD pair 14, 18 or 16, 20 may be located on a separate substrate and connected together using optical fibers. In these exemplary embodiments, a conventional semiconductor or optical fiber laser may be used to provide the continuous light 100; and one or more conventional semiconductor or optical fiber amplifiers may be used, as desired, to amplify the light portions 100' or 100", the Set input 104, the Reset input 106, or the Q output 102.

In yet other exemplary embodiments of the present invention, each EAM/PD pair 14, 18 or 16, 20 may be located on a separate substrate and attached to another substrate containing optical waveguides. As an example, each EAM/PD pair 14, 18 and 16, 20 may be fabricated on a common III-V compound semiconductor substrate and then singulated therefrom, with EAM/PD pair 14, 18 and 16, 20 being individually attached to a silicon or silicon-on-insulator (SOI) substrate containing optical waveguides formed from monocrystalline silicon, silicon dioxide, or silicon nitride. The laser 22 and one or more SOAs 36 may also be attached to the silicon or SOI substrate containing the optical waveguides.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. An optical set-reset (SR) latch, comprising:
a first electroabsorption modulator which is initially electrically biased in a light-absorptive state wherein little, if any, light which is received into an input of the first electroabsorption modulator is transmitted to an output thereof;
a second electroabsorption modulator which is optically connected to receive a first portion of the light transmitted through the first electroabsorption modulator with a second portion of the light transmitted through the first electroabsorption modulator being directed to a Q output of the optical SR latch to provide an indication of an optical logic state of the optical SR latch, and with the second electroabsorption modulator being electrically biased in a light-transmissive state wherein a majority of the first light portion received into the input of the second electroabsorption modulator is transmitted to the output thereof;
a first waveguide photodetector optically connected to receive a Set light input and the first light portion after transmission through the second electroabsorption modulator, with the first waveguide photodetector being electrically connected to the first electroabsorption modulator, and with the first waveguide photodetector, upon detecting the Set light input, generating a photocurrent signal which temporarily changes the electrical biasing of the first electroabsorption modulator and switches the first electroabsorption modulator to the light-transmissive state so that the first light portion transmitted through the second electroabsorption modulator to the first waveguide photodetector increases in intensity to a light level which continues to generate the photocurrent signal after the Set light input diminishes in intensity, thereby latching the first electroabsorption modulator in the light-transmissive state; and a second waveguide photodetector optically connected to receive a Reset light input, with the second waveguide photodetector being electrically connected to the second electroabsorption modulator, and with the second waveguide photodetector, upon detecting the Reset light input, generating another photocurrent signal which temporarily changes the electrical biasing of the second electroabsorption modulator to switch the second electroabsorption modulator to the light-absorptive state wherein the first light portion transmitted through the second electroabsorption modulator to the first waveguide photodetector diminishes in intensity to a light level wherein the photocurrent signal generated by the first waveguide photodetector is insufficient to maintain the first electroabsorption modulator in the light-transmissive state so that the first electroabsorption modulator switches back to the light-absorptive state.

2. The optical SR latch of claim 1 wherein the light received into the input of the first electroabsorption modulator is continuous light.

3. The optical SR latch of claim 2 wherein the continuous light is provided by a laser.

4. The optical SR latch of claim 1 wherein the first and second electroabsorption modulators and the first and second waveguide photodetectors are located on a substrate.

5. The optical SR latch of claim 4 further comprising a plurality of optical waveguides on the substrate to optically connect the first electroabsorption modulator to the second electroabsorption modulator, to optically connect the second electroabsorption modulator to the first waveguide photodetector, to guide the second light portion to the Q output of the optical SR latch, to guide the Set light input into the first waveguide photodetector, and to guide the Reset light input into the second waveguide photodetector.

6. The optical SR latch of claim 4 wherein the light received into the input of the first electroabsorption modulator is generated by a laser which is located on the substrate.

7. The optical SR latch of claim 4 wherein the substrate includes a III-V compound semiconductor.

8. The optical SR latch of claim 7 wherein the substrate includes an indium phosphide (InP) substrate, and the first and second electroabsorption modulators and the first and second waveguide photodetectors are formed from a plurality of III-V compound semiconductor layers which are epitaxially grown on the InP substrate.

9. The optical SR latch of claim 8 wherein the plurality of III-V compound semiconductor layers are select from the group consisting of InP layers, indium gallium arsenide phosphide (InGaAsP) layers, indium gallium arsenide (InGaAs) layers, indium aluminum gallium arsenide (InAlGaAs) layers, and combinations thereof.

10. The optical SR latch of claim 7 wherein the substrate includes a gallium arsenide (GaAs) substrate, and the first and second electroabsorption modulators and the first and second waveguide photodetectors are formed from a plurality of III-V compound semiconductor layers which are epitaxially grown on the GaAs substrate.

11. The optical SR latch of claim 10 wherein the plurality of III-V compound semiconductor layers are selected from the group consisting of GaAs layers, aluminum gallium arsenide (AlGaAs) layers, indium gallium arsenide phosphide (InGaAsP) layers, indium gallium arsenide (InGaAs) layers, and combinations thereof.

12. The optical SR latch of claim 1 wherein the first and second light portions are split out from the light transmitted through the first electroabsorption modulator by an optical splitter.

13. The optical SR latch of claim 1 wherein the light received into the input of the first electroabsorption modulator is at a wavelength in the range of 0.8-2.0 microns.

14. The optical SR latch of claim 1 further comprising at least one semiconductor optical amplifier to amplify an optical signal selected from the group consisting of the first light portion, the second light portion, the Set light input and the Reset light input.

15. The optical SR latch of claim 1 wherein the Set light input and the Reset light input include pulses of light which are gated in response to a clock input from an optical clock.

16. An optical set-reset (SR) latch, comprising:

a substrate having a first electroabsorption modulator, a second electroabsorption modulator, a first waveguide photodetector and a second waveguide photodetector formed thereon, with the first and second electroabsorption modulators and the first waveguide photodetector being arranged to provide an optical and electrical feedback loop which controls whether the first electroabsorption is in a light-transmissive state or in a light-absorptive state, with the light-transmissive state being set by providing a Set light input into the first waveguide photodetector to generate a photocurrent which reduces an electrical bias voltage across the first electroabsorption modulator, and with the first electroabsorption modulator being latched in the light-transmissive state by feedback of a continuous light input through the first and second electroabsorption modulators to the first waveguide photodetector to maintain the photocurrent and the reduced electrical bias voltage across the first electroabsorption modulator, and with the light-absorptive state being reset by providing a Reset light input into the second waveguide photodetector to change the electrical bias voltage across the second electroabsorption modulator and thereby reduce the feedback of the continuous light input through the second electroabsorption modulator to the first waveguide photodetector so that the photocurrent generated by the first waveguide photodetector is reduced and the electrical bias voltage across the first electroabsorption modulator is increased to switch the first electroabsorption modulator to the light-absorptive state until such time as another Set light input is provided to the first waveguide photodetector, and with a portion of the continuous light input which is transmitted through the first electroabsorption modulator being coupled to an optical output of the optical SR latch to indicate a logic state of the optical SR latch.

17. The optical SR latch of claim 16 wherein the substrate includes a III-V compound semiconductor substrate.

18. The optical SR latch of claim 17 wherein the III-V compound semiconductor substrate is an indium phosphide (InP) substrate, and each electroabsorption modulator and each waveguide photodetector is formed from a plurality of III-V compound semiconductor layers epitaxially grown on the InP substrate, with the plurality of III-V compound semiconductor layers being selected from the group consisting of InP layers, indium gallium arsenide phosphide (InGaAsP) layers, indium gallium arsenide (InGaAs) layers, indium aluminum gallium arsenide (InAlGaAs) layers, and combinations thereof.

19. The optical SR latch of claim 17 wherein the III-V compound semiconductor substrate is a gallium arsenide (GaAs) substrate, and each electroabsorption modulator and each waveguide photodetector is formed from a plurality of III-V compound semiconductor layers which are epitaxially grown on the GaAs substrate, with the plurality of III-V compound semiconductor layers being selected from the group consisting of GaAs layers, aluminum gallium arsenide (AlGaAs) layers, indium gallium arsenide phosphide (InGaAsP) layers, indium gallium arsenide (InGaAs) layers, and combinations thereof.

20. The optical SR latch of claim 16 further comprising a plurality of optical waveguides on the substrate to guide the Set light input to the first waveguide photodetector, to guide the Reset light input to the second waveguide photodetector, to guide the continuous light input to the first electroabsorption modulator, to optically connect the first electroabsorption modulator to the second electroabsorption modulator and the optical output for the optical SR latch, and to optically connect the second electroabsorption modulator to the first waveguide photodetector.

21. The optical SR latch of claim 16 wherein the continuous light input is provided is at a wavelength in the range of 0.8-2.0 microns.

22. The optical SR latch of claim 16 wherein the continuous light input is provided by a laser on the substrate.

23. The optical SR latch of claim 16 wherein the Set light input and the Reset light input include pulses of light which are gated in response to a clock input from an optical clock.

24. The optical SR latch of claim 16 further comprising at least one semiconductor optical amplifier on the substrate to amplify an optical signal selected from the group consisting of the Set light input, the Reset light input, the continuous light input, and the portion of the continuous light input providing the optical output for the optical SR latch.

25. The optical SR latch of claim 16 further comprising an optical waveguide splitter to separate the portion of the continuous light input which is coupled to the optical output from another portion of the continuous light which is directed through the second electroabsorption modulator to the first waveguide photodetector.

* * * * *